United States Patent
Watanabe et al.

(10) Patent No.: US 9,115,033 B2
(45) Date of Patent: Aug. 25, 2015

(54) MOISTURE ABSORBENT FOR ORGANIC ELECTROLUMINESCENCE ELEMENT AND PRODUCTION METHOD FOR SAME

(75) Inventors: Takayuki Watanabe, Ube (JP); Akihiro Moto, Ube (JP); Takuya Mishima, Ube (JP); Satoru Sano, Ube (JP); Akira Ueki, Ube (JP)

(73) Assignee: UBE MATERIAL INDUSTRIES, LTD., Ube-shi (JP)

( * ) Notice: Subject to any disclaimer, the term of this patent is extended or adjusted under 35 U.S.C. 154(b) by 0 days.

(21) Appl. No.: 14/131,241

(22) PCT Filed: Jul. 6, 2012

(86) PCT No.: PCT/JP2012/067292
§ 371 (c)(1),
(2), (4) Date: Jan. 30, 2014

(87) PCT Pub. No.: WO2013/008734
PCT Pub. Date: Jan. 17, 2013

(65) Prior Publication Data
US 2014/0166927 A1    Jun. 19, 2014

(30) Foreign Application Priority Data
Jul. 14, 2011    (JP) .............................. 2011-155397

(51) Int. Cl.
*C04B 35/628*    (2006.01)
*B01D 53/26*    (2006.01)
(Continued)

(52) U.S. Cl.
CPC ........ *C04B 35/62886* (2013.01); *B01D 53/261* (2013.01); *B01D 53/263* (2013.01);
(Continued)

(58) Field of Classification Search
CPC ............... H01L 51/5259; H05B 33/04; C04B 35/62886; B01D 53/261; B01D 53/263; B01D 52/28; B01K 20/3248; B01K 20/28057; B01K 20/28016; B01K 20/041; B01K 20/3021; B01K 20/2085; B01K 20/3204; B01K 20/3221; B01K 20/3217
USPC .............. 252/181.1–181.7, 194, 963; 34/289, 34/294, 299; 502/400
See application file for complete search history.

(56) References Cited

U.S. PATENT DOCUMENTS 5,500,041 A * 3/1996 Debuigne et al. .......... 106/38.22
7,855,509 B2 * 12/2010 Sakai et al. .................. 313/512
(Continued)

FOREIGN PATENT DOCUMENTS

JP    06-200245 A    7/2004
JP    2004-335136 A    11/2004
(Continued)

OTHER PUBLICATIONS
International Search Report for PCT/JP2012/067292, Mailing Date of Oct. 16, 2012.

*Primary Examiner* — Mark Kopec
*Assistant Examiner* — Matthew R Diaz
(74) *Attorney, Agent, or Firm* — Westerman, Hattori, Daniels & Adrian, LLP

(57) ABSTRACT

A moisture absorbent for an organic EL element having hydrophobicity and no reduction in moisture absorption speed, and a method for producing the moisture absorbent are provided. The moisture absorbent for an organic EL element includes, as a main component, calcium oxide particles each having an alkoxide layer on the surface thereof. Furthermore, the method for producing a moisture absorbent for an organic EL element includes dry-pulverizing calcium oxide in the presence of an alcohol, and thereafter dry-treating the pulverized calcium oxide.

4 Claims, 1 Drawing Sheet

(51) Int. Cl.
  *H01L 51/52* (2006.01)
  *B01D 53/28* (2006.01)
  *B01J 20/30* (2006.01)
  *B01J 20/32* (2006.01)
  *B01J 20/28* (2006.01)
  *C04B 35/626* (2006.01)
  *B01J 20/04* (2006.01)
  *H05B 33/10* (2006.01)
  *H05B 33/04* (2006.01)

(52) U.S. Cl.
  CPC .............. *B01D 53/28* (2013.01); *B01J 20/041* (2013.01); *B01J 20/28026* (2013.01); *B01J 20/28057* (2013.01); *B01J 20/3021* (2013.01); *B01J 20/3085* (2013.01); *B01J 20/3204* (2013.01); *B01J 20/3221* (2013.01); *B01J 20/3248* (2013.01); *C04B 35/6261* (2013.01); *H01L 51/5259* (2013.01); *H05B 33/04* (2013.01); *H05B 33/10* (2013.01); *B01D 2251/404* (2013.01); *B01D 2251/602* (2013.01); *B01D 2253/1124* (2013.01); *B01D 2253/20* (2013.01); *B01D 2253/25* (2013.01); *B01D 2253/304* (2013.01); *B01D 2253/306* (2013.01)

(56) References Cited

U.S. PATENT DOCUMENTS

| | | | |
|---|---|---|---|
| 7,923,480 B2* | 4/2011 | Fujita et al. | 522/81 |
| 2009/0246524 A1* | 10/2009 | Ohmi et al. | 428/402 |
| 2010/0264815 A1 | 10/2010 | Lee et al. | |

FOREIGN PATENT DOCUMENTS

| | | |
|---|---|---|
| JP | 2005-216636 A | 8/2005 |
| JP | 2005-302688 A | 10/2005 |
| JP | 2008-249559 A | 10/2008 |
| JP | 4387870 B2 | 12/2009 |

* cited by examiner

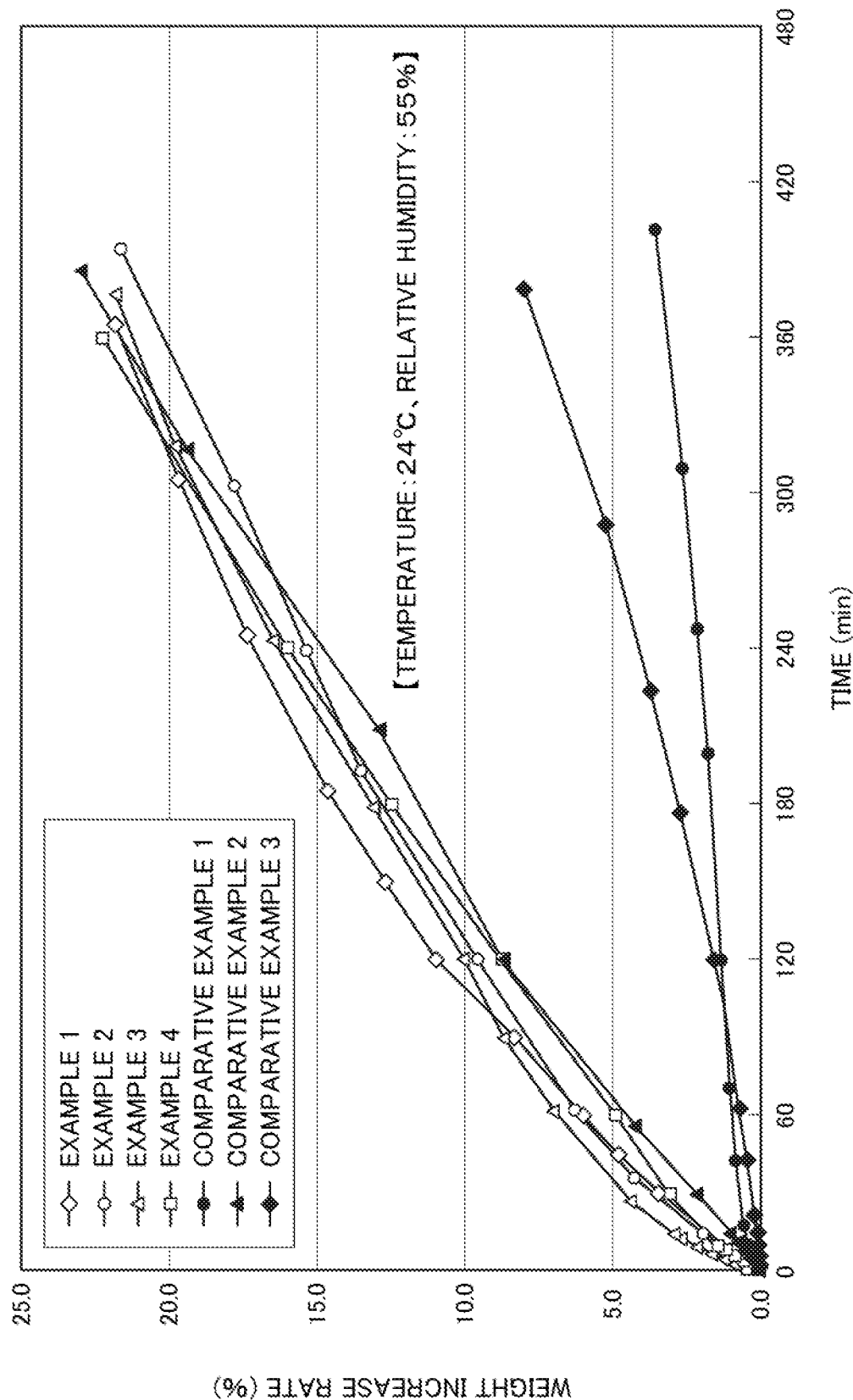

MOISTURE ABSORBENT FOR ORGANIC ELECTROLUMINESCENCE ELEMENT AND PRODUCTION METHOD FOR SAME

TECHNICAL FIELD

The present invention relates to a moisture absorbent for an organic EL (electroluminescence) element and a method for producing the same.

BACKGROUND ART

Organic luminescent materials that are used in organic EL elements have a problem that they are deteriorated by moisture, and thus the lifetimes thereof are shorten. Therefore, hygroscopic materials moisture getters) have been conventionally disposed so as to absorb moisture that remains in organic EL elements during the production of the elements or moisture that enters from outside.

Since moisture getters are required to rapidly absorb moisture, after sealing, barium oxide or strontium oxide, or calcium oxide having an enhanced moisture absorption speed is used. Furthermore, for example, as disclosed in Patent Literature 1, calcium oxide having an enhanced moisture absorption speed can be obtained by calcining calcium hydroxide under a reduced pressure condition.

CITATION LIST

Patent Literature

Patent Literature 1: JP 4387870 B1

SUMMARY OF INVENTION

Technical Problem

However, calcium oxide has strong alkalinity and thus has a problem that, in the case when it is contained in an organic polymer material such as a resin and used, it may cut the bonds of the polymer, and thus cannot be utilized in only some resins such as fluorine resins. Furthermore, calcium oxide is hydrophilic and thus has a problem that calcium oxide is difficult to be contained in organic polymer materials such as hydrophobic resins.

As a method for solving these problems, a method including modifying the surfaces of particles has been conventionally known. However, regarding this use, the method has a problem that, although calcium oxide can be modified to be hydrophobic when the surface of the calcium oxide is coated with a surface treating agent such as an aliphatic acid, the moisture absorption speed is lowered and the original activity is lost.

The present invention was made in view of the above-mentioned problems, and aims at providing the moisture absorbent for an organic EL element having hydrophobicity and no decrease in moisture absorption speed, and a method for producing the moisture absorbent.

Solution to Problem

The present inventors conducted intensive studies so as to achieve the above-mentioned object, and consequently found that calcium oxide particles each having an alkoxide layer on the surface thereof have hydrophobicity due to the alkyl groups possessed by the alkoxide layer and have no decrease in moisture absorption speed, and reached the present invention. Namely, the present invention provides a moisture absorbent for an organic EL element including, as a main component, calcium oxide particles each having an alkoxide layer on the surface thereof.

Furthermore, the present inventors found that calcium oxide is subjected to dry pulverization in the presence of an alcohol to obtain fine calcium oxide particles having an enhanced activity and each having an alkoxide layer on the surface thereof, and reached the present invention. Namely, the present invention provides a method for producing a moisture absorbent for an organic EL element, including dry-pulverizing calcium oxide in the presence of an alcohol, and thereafter dry-treating the pulverized calcium oxide.

Advantageous Effects of Invention

As mentioned above, according to the present invention, there are provided a moisture absorbent for an organic EL element having hydrophobicity and no decrease in moisture absorption speed, and a method for producing the moisture absorbent.

BRIEF DESCRIPTION OF DRAWING

FIG. 1 is a graph showing the weight increase rate (moisture absorption speed) of the respective CaO powders in Examples.

DESCRIPTION OF EMBODIMENTS

The moisture absorbent for an organic EL element according to the present invention includes, as a main component, calcium oxide particles each having an alkoxide layer. The alkoxide layer is present on the surface of each calcium oxide particle, and may include layers of, for example, calcium methoxide, calcium ethoxide, calcium propoxide, calcium butoxide and the like. Furthermore, the moisture absorbent for an organic EL element according to the present invention has a BET specific surface area of, preferably 10 to 100 $m^2/g$, more preferably 15 to 100 $m^2/g$, even more preferably 15 to 60 $m_2/g$. Furthermore, the moisture absorbent has an average particle diameter of, preferably 0.2 to 10 μm, more preferably 0.5 to 3 μm. Furthermore, the moisture absorbent has a bulk density of, preferably 0.5 to 1.5 $g/cm^3$, more preferably 0.7 to 1.2 $g/cm^3$.

Considering that an alkoxide is hydrolyzed to decompose into water and an alcohol and an alkoxide is generated by a reaction between the alcohol and calcium oxide, the mechanism of hygroscopicity in the moisture absorbent for an organic EL element according to the present invention is considered such that the reaction represented by the following formula (1) occurs from the right to left through the alkoxide layer with respect to moisture absorption, and an alkoxide is again generated from the alcohol and calcium oxide by the reaction from the left to right represented by the following formula (1). Furthermore, the excess moisture reacts with the calcium oxide in the particles and is retained as calcium hydroxide.

[Chemical Formula 1]

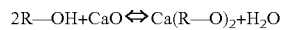

The moisture absorbent for an organic EL element according to the present invention can be produced by dry-pulverizing calcium oxide in the presence of an alcohol, and thereafter drytreating the pulverizing calcium oxide.

In the method for producing the moisture absorbent for an organic EL element according to the present invention, the BET specific surface area of the calcium oxide used as a raw material is, but is not specifically limited to, preferably 0.1 to 60 m$^2$/g, more preferably 0.5 to 30 m$^2$/g. Furthermore, the average particle diameter of the calcium oxide is, but is not specifically limited to, preferably 1 µm to 5 mm.

In the method for producing the moisture absorbent for an organic EL element according to the present invention, the alcohol used is preferably an alcohol with a carbon number of 1 to 6, and specifically preferably an alcohol with a carbon number of 1 to 4 from the viewpoints of easy availability, easiness of handling, and the like. Specifically preferable alcohols may include methanol, ethanol, 1-propanol, 2-propanal, butanol and the like. Those may be used singly or as a mixture of two or more kinds. In the method for producing the moisture absorbent for an organic EL element according to the present invention, since the alcohol is used for generating the alkoxide layer, the use amount thereof is preferably 1 to 20 mass %, more preferably 5 to 15 mass % with respect to the calcium oxide.

In the method for producing the moisture absorbent for an organic EL element according to the present invention, although the method for the dry pulverization is not specifically limited, pulverizing apparatuses such as a media mill, a rotary ball mill, a vibratory ball mill, a planetary ball mill, a rocking mill and a paint shaker can be used. Among pulverizing apparatuses, preferable ones are pulverizing apparatuses using media of metals, resins and ceramics as media such as a media mill and a rocking mill. The media are desirably made of materials such as nylons due to their small contamination or made of zirconia due to its small wearing. In addition, the sizes of the media can he suitably selected depending on the particle size of a substance to be pulverized. Furthermore, it is preferable to conduct the pulverization in an inert gas atmosphere. The inert gas may include helium, argon and the like, but it is specifically preferable to conduct in a nitrogen as atmosphere in view of cost-efficiency.

The pulverization may be conducted by a single step, or the pulverization may be conducted by multiple steps by changing the media diameter and pulverizer.

In the method for producing the moisture absorbent for an organic EL element according to the present invention, the dry treatment is conducted by heat drying, and examples of the drying apparatus may include a tray drier, a rotary drier, an vibration drier and the like. The calcium oxide particles each having an alkoxide layer are preferably dried while introducing an inert gas such as a nitrogen gas and an argon gas into the drier so as to prevent the decomposition of the alkoxide layer and the generation of calcium hydroxide and calcium carbonate by the reactions with the water vapor and carbon dioxide in the atmosphere. The temperature for the heat drying treatment is not more than the decomposition temperature of the alkoxide layer, and is preferably 80 to 180° C., more preferably 120 to 170° C.

According to the present invention, a moisture absorbent for an organic EL element having hydrophobicity and a moisture absorption speed that is not lowered as compared to that of general CaO can be produced. Furthermore, the moisture absorbent for an organic EL element according to the present invention has excellent effects that the moisture absorbent has a large bulk density and thus is easily filled in resins, the moisture absorbent has a small oil absorption amount and thus can be highly filled in resins, and the like. The oil absorption amount is an index for evaluating the filling property of a powder into a resin, and this method can be used for evaluating the filling property (journal "Industrial Material" Vol. 39, No. 1, p 116-117 (1991)).

Therefore, the moisture absorbent for an organic EL element according to the present invention can be dispersed in a synthetic resin and formed into a sheet, a pellet, a plate or a film. These formed products can be advantageously used as drying agents for electronic devices such as organic EL displays. As the synthetic resin, polyolefin resins, polyacrylic resins, polyacrylonitrile resins, polyamide resins, polyester resins, epoxy resins, polycarbonate resins and fluorine resins can be used.

Furthermore, the moisture absorbent for an organic EL element according to the present invention can also be used in a state in which it is contained in a moisture-permeable bag or container that is used for a general desiccant. Furthermore, the moisture absorbent for an organic EL element according to the present invention may be used singly or in combination with other hygroscopic materials (e.g., silica gel and molecular sieves).

EXAMPLES

Hereinafter the present invention will be specifically explained based on Examples, but these Examples do not limit the purpose of the present invention. Firstly, methods for measuring the physical properties of the obtained CaO powders will be shown below.

[Evaluation of Hygroscopicity]

A petri dish that had been dried in advance was weighed and defined as [A (g)] About 0.6 q of a powder to be measured was charged in the petri dish, and the petri dish containing the powder was properly weighed and defined as [B (g)]. The petri dish containing the powder was put into a thermo-hygrostat kept at 24° C. and a relative humidity of 55%, weighted after 120 minutes, and defined as [C (g)], and the weight increase rate was calculated by the following formula (2).

[Mathematical Formula 1]

$$\text{Weight increase rate (\%)} = (C[g] - B[g])/(B[g] - A[g]) \times 100 \quad (2)$$

[Method for Measuring Oil Absorption Amount]

A measurement was conducted according to JIS K5101-13-2:2004 Pigment Test Method—Part 13: Oil Absorption Amount—Section 2: Boiled Linseed Oil Method. Boiled linseed oil was added dropwise to a predetermined amount of a powder sample, and the oil absorption amount (mL/100 g) was obtained from the dropwise addition amount at the endpoint at which the sample kneaded together with the boiled linseed oil was put into a state that it was able to be helically wound.

[Method for Measuring Average Particle Diameter]

Using ethanol as a dispersing solvent for the sample, and a dispersing treatment was conducted for 3 minutes in an ultrasonic homogenizer (MODEL US-150T, manufactured by Nihon Seiki Kaisha LTD.). The average particle diameter of the dispersed sample was measured by using a laser diffraction-type particle size distribution meter (MICROTRAC HRA9320-X100, manufactured by Nikkiso Co., Ltd.).

[Method for Measuring BET Specific Surface Area]

The BET specific surface area was measured by BET one-point method using Monosorb (manufactured by Quantachrome).

[Method for Evaluating Dispersibility in Organic Solvent]

The dispersibility of the sample in an organic solvent was evaluated by using n-hexane. 5 ml of n-hexane was put into a glass bottle, about 0.1 g of the sample was added, the mixture was shaken for a minute and allowed to still standing, and the appearance of the solution after 30 seconds was observed.

When the sample was dispersed in the hexane and the solution was turbid, the dispersibility of the sample in the organic solvent was evaluated to be fine (◯), whereas when the sample flocculated in the hexane and precipitated while the hexane was transparent, the dispersibility of the sample in the organic solvent was evaluated to be poor (×).

[Method for Measuring Bulk Density]

The sample was gently put into a quartz container having a volume of 4.4 cm$^3$ (bottom surface: 10 mm×10 mm, height: 44 mm) in a glovebox filled with nitrogen to thereby heap the container with the sample. The powder was levelled off, properly weighed and defined as [D (g)], and the bulk density was calculated by the following formula (3).

[Mathematical Formula 2]

Bulk density (g/cm$^3$)=$D$ (g)/4.4 (cm$^3$)     (3)

[Method for Measuring FT-IR]

The measurement of FT-IR was conducted by an assembly of a single reflection measurement apparatus (ATR PRO470-H) and a Fourier transform infrared spectrometer (FT/IR-6100, manufactured by JASCO Corporation), and conducting a measurement. The range of the measured wave number is 4,000 to 400 cm$^{-1}$.

Example 1

120 g of zirconia beads having a diameter φ of 4.0 mm manufactured by Nikkato Corporation), 6 g of a granulated product of a high specific surface area calcium oxide (BET specific surface area: 16.5 m$^2$/g, particle size: 2-3 mm), which is formed by calcining a granulated product of a micro powder of calcium hydroxide at 600° C., and 0.45 g of ethanol were added to a 100 mL airtight container (made of polypropylene), and the container was sealed. The above-mentioned operation was conducted in a glovebox filled with nitrogen so that this sealed container was filled with nitrogen. This sealed container was removed from the glovebox and the content was subjected to a pulverization treatment in a rocking mill (Seiwa Giken Co., Ltd.) for 4 hours at 700 rpm. After the treatment, the zirconia beads and CaO powder were separated from each other by using a sieve with an opening of 500 μm in a glovebox filled with nitrogen. The separated and collected CaO powder was subjected to a dry treatment in a tray drier in a nitrogen atmosphere at 150° C. for 18 hours to give a CaO powder having particle surfaces coated with an alkoxide. The presence of an alkoxide layer on the surface of the obtained CaO powder was confirmed by FT-IR. The physical properties of the obtained CeO powder are shown in Table 1.

Example 2

The production was conducted in a similar manner to that of Example 1, except that a high purity calcium oxide powder (ultra-high purity calcia (CSQ), BET specific surface area: 2.3 m$^2$/g, average particle diameter: 16.5 μm, manufactured by Ube Material Industries, Ltd.) was used instead of the high-specific surface area calcium oxide granulated product. The presence of an alkoxide layer on the surface of the obtained CaO powder was confirmed by FT-IR. The physical properties of the obtained CaO powder are shown in Table 1.

Example 3

The production was conducted in a similar manner to that of Example 2, except that 2-propanol was used instead of ethanol. The presence of an alkoxide layer on the surface of the obtained CaO powder was confirmed by ET-IR. The physical properties of the obtained CaO powder are shown in Table 1.

Example 4

The production was conducted in a similar manner to that of Example 2, except that I-butanol was used instead of ethanol. The presence of an alkoxide layer on the surface of the obtained CaO powder was confirmed by ET-IR. The physical properties of the obtained CaO powder are shown in Table 1.

Comparative Example 1

A high purity calcium oxide powder (ultra-high purity calcia (CSQ), BET specific surface area: 2.3 m$^2$/g, average particle diameter: 16.5 μm, manufactured by Ube Material Industries, Ltd.) was used. The physical properties of this CaO powder are shown in Table 1.

Comparative Example 2

Calcium oxide manufactured by Sigma-Aldrich (nano powder particle size <160 nm (BET)) was used. The physical properties of this CaO powder are shown in Table 1.

Comparative Example 3

0.065 g of stearic acid was dissolved in 40 mL of diethyl ether. 1.3 g of calcium oxide manufactured by Sigma-Aldrich (nano powder particle size 160 nm (BET)) was added to this solution and mixed for 10 minutes. The mixed solution was dried in vacuum at 30° C. for 12 hours to thereby remove the solvent. The collected dried powder was subjected to a cracking treatment by using an agate mortar in a glovebox filled with nitrogen to thereby obtain a CaO powder whose surface had been treated with an aliphatic acid. The physical properties of the obtained CaO powder are shown in Table 1.

TABLE 1

|  | BET (m$^2$/g) | Average Particle diameter (μm) | Bulk density (g/cm$^3$) | Evaluation of hygroscopicity (see FIG. 1) Temperature: 24° C. Relative humidity: 95% Weight increase rate after 120 min (%) | Oil absorption amount (ml/100 g) | Evaluation of dispersibility in organic solvent Solvent: n-hexane CH$_3$(CH$_2$)$_4$CH$_3$ |
|---|---|---|---|---|---|---|
| Example 1 | 43 | 2.60 | 0.83 | 10.9 | 25 | ◯ |
| Example 2 | 25 | 0.83 | 0.86 | 9.5 | 20 | ◯ |
| Example 3 | 18 | 1.77 | 0.98 | 10.0 | 30 | ◯ |
| Example 4 | 33 | 1.16 | 0.87 | 8.7 | 25 | ◯ |
| Comparative Example 1 | 2.3 | 16.5 | 0.69 | 1.3 | 80 | X |

TABLE 1-continued

| | BET ($m^2/g$) | Average Particle diameter (μm) | Bulk density ($g/cm^3$) | Evaluation of hygroscopicity (see FIG. 1) Temperature: 24° C. Relative humidity: 95% Weight increase rate after 120 min (%) | Oil absorption amount (ml/100 g) | Evaluation of dispersibility in organic solvent Solvent: n-hexane $CH_3(CH_2)_4CH_3$ |
|---|---|---|---|---|---|---|
| Comparative Example 2 | 24 | 0.87 | 0.21 | 8.7 | 50 | X |
| Comparative Example 3 | 20 | 0.86 | 0.79 | 1.5 | 135 | ○ |

The invention claimed is:

1. A moisture absorbent for an organic electroluminescence element, comprising, as a main component, calcium oxide particles each having an alkoxide layer on a surface thereof,
wherein the alkoxide layer consists essentially of a calcium alkoxide.

2. The moisture absorbent according to claim 1, wherein the calcium oxide particles have an average particle diameter of 0.2 to 10 μm.

3. The moisture absorbent according to claim 1, wherein the moisture absorbent has a bulk density of 0.5 to 1.5 $g/cm^3$.

4. A method for producing a moisture absorbent for an organic electroluminescence element, comprising dry-pulverizing calcium oxide in the presence of an alcohol, and thereafter dry-treating the pulverized calcium oxide, so as to obtain the moisture absorbent of claim 1.

* * * * *